United States Patent [19]

Gillingham

[11] Patent Number: 5,546,350
[45] Date of Patent: Aug. 13, 1996

[54] RAM VARIABLE SIZE BLOCK WRITE

[75] Inventor: Peter B. Gillingham, Kanata, Canada

[73] Assignee: Mosaid Technologies Incorporated, Kanata, Canada

[21] Appl. No.: 226,035

[22] Filed: Apr. 11, 1994

[51] Int. Cl.$^6$ .............................. G11C 7/00; G11C 8/00
[52] U.S. Cl. .............................. 365/230.06; 365/189.04
[58] Field of Search .................. 365/230.06, 230.01, 365/189.01, 189.04

[56] References Cited

U.S. PATENT DOCUMENTS 5,311,479  5/1994  Harada .................. 365/230.06
5,329,492  7/1994  Mochizuki .................. 365/230.06 X

*Primary Examiner*—Do Hyun Yoo
*Attorney, Agent, or Firm*—Pascal & Associates

[57] ABSTRACT

A method of enabling a controllable and variable number of bits to be written to a group of cells of a DRAM or SRAM simultaneously in a block, wherein a predecoded column address signal is decoded for enabling writing to cells of the DRAM or SRAM, and the predecoded column address signal is block overwritten by means of a block address signal, whereby plural decoders are enabled simultaneously for simultaneous writing to a column of cells notwithstanding the logic levels of the predecoded address signal.

10 Claims, 3 Drawing Sheets

RAM VARIABLE SIZE BLOCK WRITE

FIELD OF THE INVENTION

This invention relates to semiconductor dynamic random access memories (DRAMs) and static random access memories (SRAMs), and in particular a method and apparatus for writing data to cells of the memory in selectable blocks.

BACKGROUND TO THE INVENTION

The invention will be described in detail in the context of DRAMs, although it is equally applicable to SRAMs.

Bit line decoders (sometimes referred to as Y decoders) typically have several (e.g. 3 or 4) inputs, each of which is chosen from a group of plural decoded addresses (e.g. 4). Normally only one signal in each group of four would be "1" at any time.

Referring to FIG. 1, each of a group of Y decoders, shown as NAND gates 2, have their outputs connected to the gates of a pair of access field effect transistors 4, for enabling connection of bit lines such as BL0, /BL0, BL1 and /BL1 to data bus lines DB0, /DB0, DB1 and /DB1 respectively output via sense amplifiers 6. The inputs of NAND gates 2 are connected to different predecoder lines 8 of predecoder buses. The lines of the predecoder buses are connected to the outputs of predecoders, in the embodiment shown being the outputs of groups of gates 10A and 10B.

The inputs of the group of gates 10A are connected to a source of Y address signals, Yi and Y(i+1), and the inputs of the group of gates 10B are connected to a source of Y address signal, Y(i+2), Y(i+3). The sources of address signals are input pins to the DRAM.

In a typical memory array consisting of $2^{10}$ (1024) bit lines, where four bits of data are accessed simultaneously via four differential databuses, $2^8$ (256) Y-decoders each consisting of four input gates, each input chosen from a group of four predecoded addresses, would determine which four bitlines to connect to the databus. The Y-decoders themselves could be implemented as NAND or NOR gates through the application of deMorgan's theorem.

In operation, normally only one signal on each of the predecoder lines 8 is "1" at a time, whereby a single decoder is enabled. This limits the ability of the DRAM to provide a block write to plural DRAM cells, with variable and selectable size of the block of cells to be written. Large block writes are accomplished by sequentially writing to groups of bitlines addressed by one Y-decoder. In applications such as computer graphics, where large fields of memory are written with the same value, the speed of block writes implemented sequentially can seriously degrade performance.

Standard video random access memory (VRAM) includes a block write feature, but it is only for a fixed sized block of four or eight addresses. Larger blocks would still require a slow, sequential operation.

A truth table of Y address input and predecoder line logic level is as follows:

TABLE A

| Y Address | | Precoder One Logic Level | | | |
|---|---|---|---|---|---|
| Yi | Yi + i = Yj | Yij(0) | Yij(1) | Yij(2) | Yij(3) |
| 0 | 0 | 1 | 0 | 0 | 0 |
| 1 | 0 | 0 | 1 | 0 | 0 |
| 0 | 1 | 0 | 0 | 1 | 0 |

TABLE A-continued

| Y Address | | Precoder One Logic Level | | | |
|---|---|---|---|---|---|
| Yi | Yi + i = Yj | Yij(0) | Yij(1) | Yij(2) | Yij(3) |
| 1 | 1 | 0 | 0 | 0 | 1 |

SUMMARY OF THE INVENTION

In accordance with an embodiment of the invention, the address predecoders can be overridden with a logic signal that can be interpreted by each group of predecoders as an address, which allows plural ones of the decoders to become enabled at the same time. The number of decoders which are overridden is variable and programmable, thus facilitating turn on and control over the number of decoders that are turned on, and thus control over the size of the block (and thus the page size) that is written to the memory cells.

In accordance with an embodiment of the invention, a method of enabling a controllable and variable number of bits to be written to a group of cells of a DRAM or SRAM simultaneously in a block, is comprised of decoding a predecoded signal and enabling writing to cells of the DRAM defined by the decoding, predecoding an address signal and providing the predecoded signal, and overriding the predecoded address signal by means of an address signal.

In accordance with another embodiment, a semiconductor dynamic or static random access memory (DRAM or SRAM) is comprised of a plurality of Y decoders, a plurality of predecoders having outputs connected to the Y decoders, apparatus for applying address signals to inputs of the predecoders, and apparatus for applying an overriding address signal to plural ones of the predecoders whereby a block of Y decoders are enabled together.

In accordance with another embodiment, in a DRAM or SRAM, a plurality of Y decoder input gates, each having an output connected to gates of pass-through field effect transistors for connecting bit lines to data buses of the DRAM, plural Y address inputs connected to predecoder gates each for decoding N address bits to $2^n$ predecoder lines, each input of a Y decoder plural input gate being connected to a different set of predecoder lines whereby different sets of address bits may be presented to corresponding different Y decoder plural input gates, and apparatus for applying an overriding address word to plural inputs of the predecoder gates for decoding by a group of Y decoder plural input gates and enabling a corresponding group of pass-through transistors simultaneously.

BRIEF INTRODUCTION TO THE DRAWINGS

A better understanding of the invention will be obtained by reading the description of the invention below, with reference to the following drawings, in which:

FIG. 1 is a logic diagram of a decoding portion of a DRAM in accordance with the prior art, FIG. 2 is a logic diagram of a portion of the decoding portion of a DRAM of FIG. 1, modified in accordance with an embodiment of the present invention, FIG. 3 illustrates a logic diagram in accordance with another embodiment of the invention, and FIG. 4 is a timing diagram relating to operation of an embodiment of the invention.

DETAILED DESCRIPTION OF THE INVENTION

Figure 1:
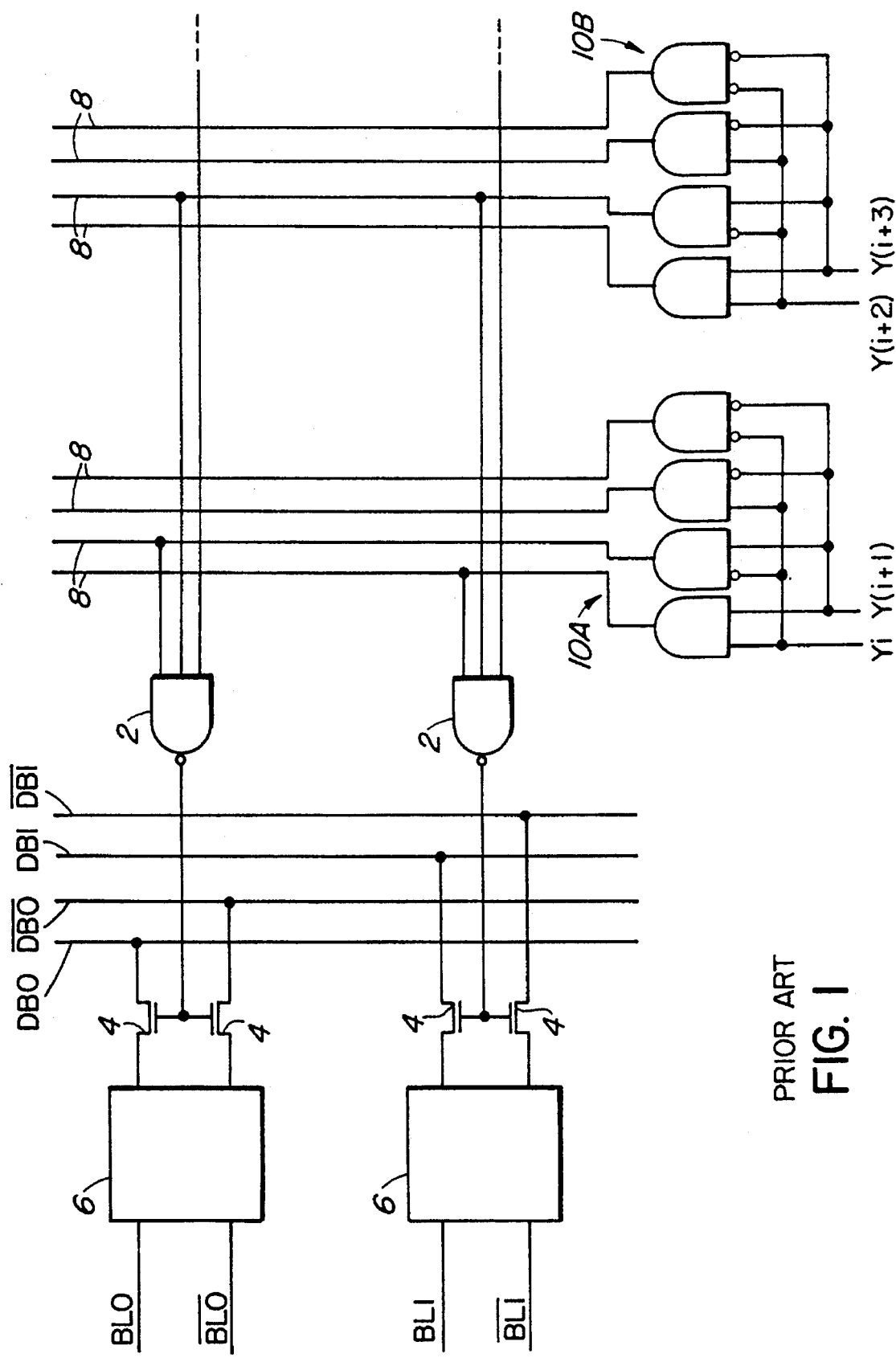
Figure 2:
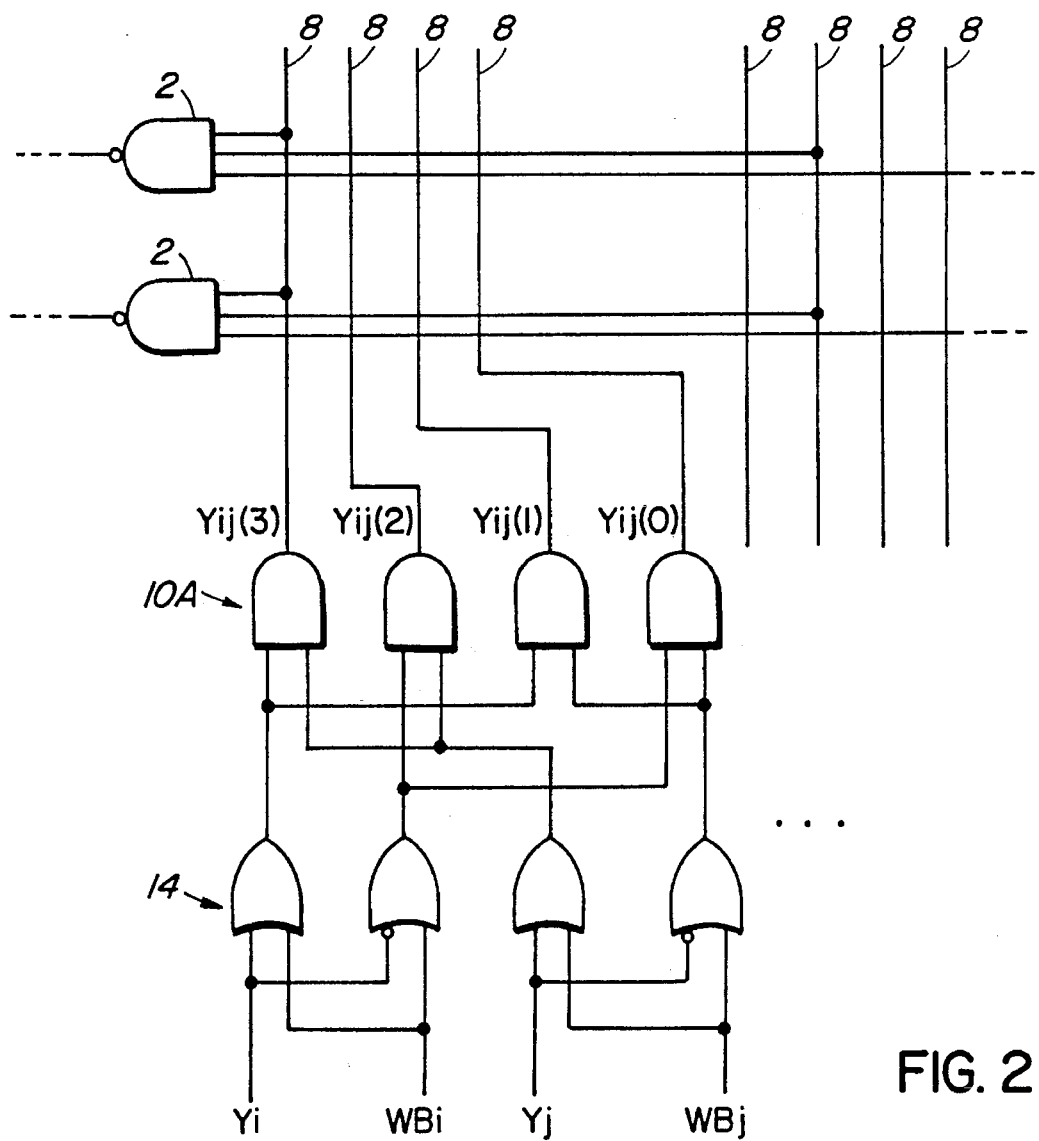

Turning now to FIG. 2, in accordance with one embodiment the predecoder gates, e.g. 10A, have their parallel pairs of inputs connected to the respective outputs of gates 14. The inputs of gates 14 are connected in parallel, one input being connected to an address line carrying the address signal Yi and the other being connected to a line carrying a block write signal WBi. This structure allows any raw address block to be overwritten.

With respect to the truth table shown in Table B, any contiguous block of addresses of size $2^k$ (for example block A, where k=2), beginning at any address $m2^k$ (block A, m=1) can be overwritten as follows: all addresses $Y_{k-1}, Y_{k-2} \ldots Y_o$ and $/Y_{k-1}, /Y_{k-2} \ldots /Y_o$ are forced to 1. The remaining addresses Yn ... Yk are set to $m2^k$.

Thus, to implement a block write indicated as A in table B, each of the predecoder lines connected to the outputs of the predecoders, i.e. $Y_{01(o)}, Y_{01(1)}, Y_{01(2)}$ and $Y_{01(3)}$, must be forced to logic level '1'.

Input lines $WB_0$ and $WB_1$, which are normally at logic '0' levels during non-block write operations, are set to logic '1' levels to force all four predecoded address lines to '1'. Plural decoders are thus enabled simultaneously.

Since the control of input lines WB0 ... WBn is programmable, a variable and controllable block may be written to the DRAM cells resulting from the addresses decoded by decoders 2.

Figure 3:
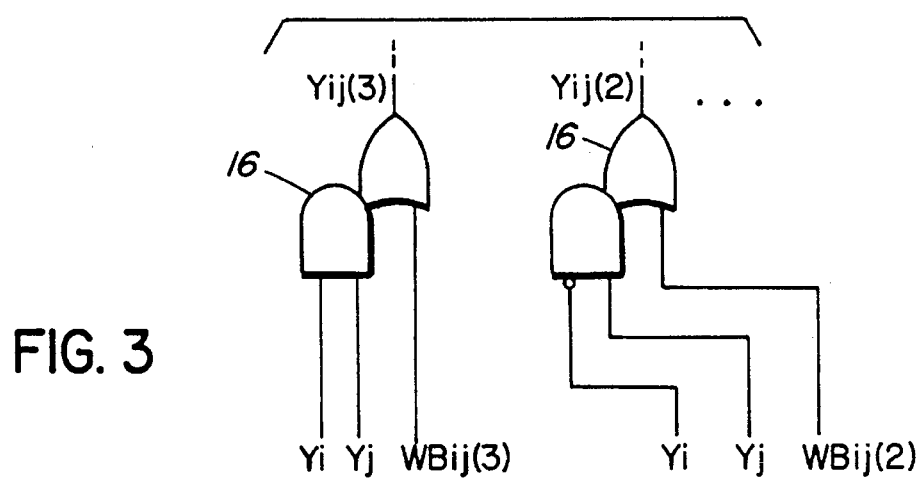

In accordance with another embodiment, block sizes of $2^k$ or $3*2^k$ can be written in single block write operations. A logic circuit corresponding to FIG. 2 to implement the invention is shown in FIG. 3.

Three-input gates 16 have inputs $Y_i$ and $Y_j$ to two inputs of one of the gates, with an independent block write input $WB_{ij(x)}$ for each predecoder output. Block sizes of $2^k$ or $3*2^k$ can be addressed (such as $3.2^k$, where k=2 encompassing block B in table B), beginning at any address $m2^{k+1}$ (block B, m=0) or $m2^{k+1}+2k$ can be overwritten as follows. All predecoded addresses $Y_{k-2,k-1}, Y_{k-4,k-3} \ldots Y_{01}$ are forced to 1. Predecoded addresses $Y_{k-1,k(0)}, Y_{k-1,k(2)}$ are forced to 1. The remaining addresses $Y_{n,n-1}, Y_{n-2,n-3} \ldots Y_{k+1,k+2}$ are set to $m2^{k+1}$. The predecoded addresses are forced to 1 by the block control inputs on lines $WB_{ij}$. As a result the address signals on predecoder lines 8 corresponding to the addresses in block B are overridden and a variable and controllable block may be written to the DRAM cells resulting from the overridden addresses.

In DRAM or SRAM memories there will be an upper limit on the number of sense amplifiers (in the case of DRAM) or memory cells (in the case of SRAM), that the write driver will be capable of overwriting. In the worst case all sense amplifiers or cells will have opposite data to the data being written and the write driver output transistor must be more powerful than all sense amplifiers or cell transistors in parallel. This sets an upper limit on the block size for the block write operation.

In DRAM it is possible to overcome this limit by writing to the bitlines before the sense amplifier is enabled. The write driver must charge up the bit line capacitance to the write data value prior to enabling the sense amplifiers without having to overcome sense amplifier drive current. Sense amplifiers can be enabled later to fully restore data.

Figure 4:
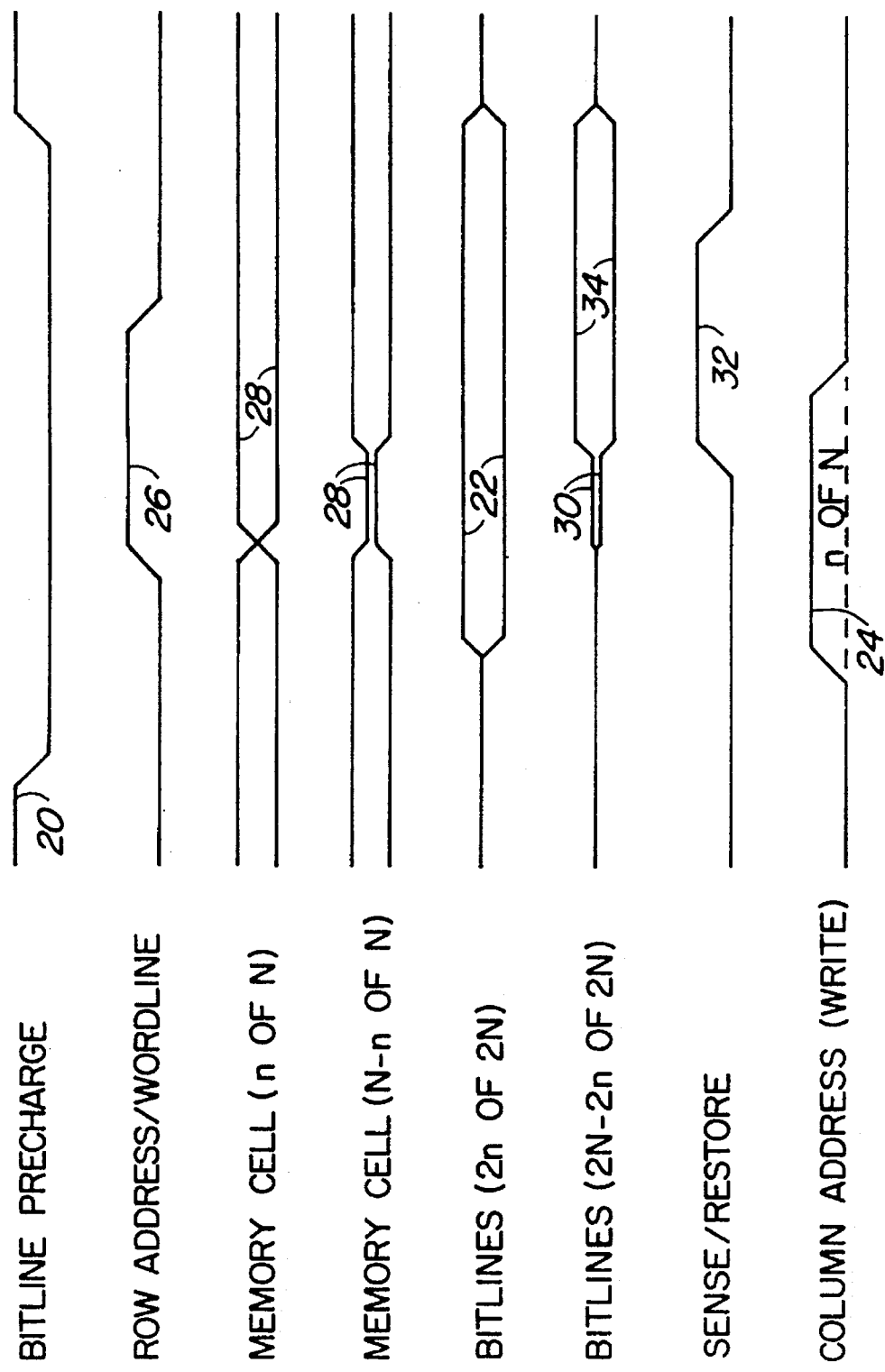

FIG. 4 is a timing diagram illustrating the above, wherein n bits are written in a block write, n=1 ... N. After the precharge interval 20 ends, the bitlines are charged, during interval 22, which is initiated by a column address 24. The wordline is addressed by address 26, and the selected memory cells are connected to the bitlines that hold the write data, as shown by logic levels 28 and 29 thereby completing the block write operation. Unselected bit lines are charged with all data (levels 30), and following a bit line sense 32 the bitline capacitance becomes fully charged and restored with original unaltered data from the cells.

It should be noted that n must be a power of 2, or 3 times a power of 2 due to the column address format in most DRAMs. Groups of 2 column address bits are predecoded to form a 1 of 4 set of predecoded addresses. For example 10001101 would be predecoded to 0100,0001,1000,0010. To perform a block write on 48 column addresses starting at address 128 the predecoded addresses would be 0010,0111, 1111,1111.

A person understanding this invention may now conceive of alternative structures and embodiments or variations of the above. All of those which fall within the scope of the claims appended hereto are considered to be part of the present invention.

TABLE B

| $Y_n^{01}$ | $Y_5$ | $Y_4$ | $Y_3$ | $Y_2$ | $Y_1$ | $Y_0$ | $Y_{01}(0)$ | $Y_{01}(1)$ | $Y_{01}(2)$ | $Y_{01}(3)$ | $Y_{23}(0)$ | $Y_{23}(1)$ | $Y_{23}(2)$ | | |
|---|---|---|---|---|---|---|---|---|---|---|---|---|---|---|---|
| | 0 | 0 | 0 | 0 | 0 | 0 | 1 | 0 | 0 | 0 | 1 | 0 | 0 | | |
| | 0 | 0 | 0 | 0 | 0 | 1 | 0 | 1 | 0 | 0 | 1 | 0 | 0 | | |
| | 0 | 0 | 0 | 0 | 1 | 0 | 0 | 0 | 1 | 0 | 1 | 0 | 0 | | |
| | 0 | 0 | 0 | 0 | 1 | 1 | 0 | 0 | 0 | 1 | 1 | 0 | 0 | | |
| | 0 | 0 | 0 | 1 | 0 | 0 | 1 | 0 | 0 | 0 | 0 | 1 | 0 | | |
| | 0 | 0 | 0 | 1 | 0 | 1 | 0 | 1 | 0 | 0 | 0 | 1 | 0 | A | B |
| | 0 | 0 | 0 | 1 | 1 | 0 | 0 | 0 | 1 | 0 | 0 | 1 | 0 | | |
| | 0 | 0 | 0 | 1 | 1 | 1 | 0 | 0 | 0 | 1 | 0 | 1 | 0 | | |
| | 0 | 0 | 1 | 0 | 0 | 0 | 1 | 0 | 0 | 0 | 0 | 0 | 1 | | |
| | 0 | 0 | 1 | 0 | 0 | 1 | 0 | 1 | 0 | 0 | 0 | 0 | 1 | | |
| | 0 | 0 | 1 | 0 | 1 | 0 | 0 | 0 | 1 | 0 | 0 | 0 | 1 | | |
| | 0 | 0 | 1 | 0 | 1 | 1 | 0 | 0 | 0 | 1 | 0 | 0 | 1 | | |

I claim:

1. A method of enabling a controllable and variable number of bits to be written to a group of cells of a DRAM or SRAM simultaneously in a block, comprising decoding a predecoded column address signal for enabling writing to cells of said DRAM or SRAM, and block overwriting said predecoded column address signal by means of a block address signal, whereby plural decoders are enabled simultaneously for simultaneous writing to a column of cells notwithstanding logic levels of the predecoded column address signal.

2. A method as defined in claim 1 in which said block address signal is variable.

3. A method as defined in claim 1 including enabling sense amplifiers of the DRAM or SRAM prior to the block overwriting step.

4. A method as defined in claim 1 including disabling sense amplifiers of the DRAM or SRAM prior to the block overwriting step.

5. A method of enabling a controllable and variable number of bits to be written to a block of cells of a DRAM or SRAM simultaneously in a block, comprising receiving a plurality of row decoder addresses for decoding and enabling sensing and writing to cells of said DRAM or SRAM, and overwriting said row decoder addresses by means of a block address signal, whereby plural decoders are enabled simultaneously for simultaneous writing to a column of cells notwithstanding logic levels of the row decoder addresses.

6. A method as defined in claim 5 in which said block address signal is variable.

7. A method as defined in claim 5 including enabling sense amplifiers of the DRAM or SRAM prior to the overwriting step.

8. A method as defined in claim 5 including disabling sense amplifiers of the DRAM or SRAM prior to the overwriting step.

9. A semiconductor dynamic or static random access memory (DRAM or SRAM) comprising a plurality of Y decoders, a plurality of predecoders having outputs connected to the Y decoders, means for applying address signals to inputs of the predecoders, and means for applying an overriding address signal to other inputs of plural ones of the predecoders whereby a block of the Y decoders are enabled at the same time.

10. A semiconductor DRAM or SRAM comprising a plurality of Y decoders, a plurality of input gates having outputs connected to respective inputs of the Y decoders, means for applying row addresses to inputs of said gates, and means for applying an overwriting block address signal to another input of each gate of a plurality of said gates, whereby plural Y decoders are enabled simultaneously for simultaneously writing to a column of cells notwithstanding a logic level of the row addresses.

* * * * *